United States Patent
Goh et al.

(10) Patent No.: US 9,287,238 B2
(45) Date of Patent: Mar. 15, 2016

(54) LEADLESS SEMICONDUCTOR PACKAGE WITH OPTICAL INSPECTION FEATURE

(71) Applicant: Infineon Technologies AG, Neubiberg (DE)

(72) Inventors: Soon Lock Goh, Melaka (MY); Swee Kah Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/094,207

(22) Filed: Dec. 2, 2013

(65) Prior Publication Data

US 2015/0155229 A1 Jun. 4, 2015

(51) Int. Cl.
| | |
|---|---|
| H01L 23/00 | (2006.01) |
| H01L 23/495 | (2006.01) |
| H01L 23/31 | (2006.01) |
| H01L 21/56 | (2006.01) |
| H01L 21/48 | (2006.01) |

(52) U.S. Cl.
CPC ............ *H01L 24/97* (2013.01); *H01L 21/4832* (2013.01); *H01L 21/561* (2013.01); *H01L 23/3107* (2013.01); *H01L 23/49513* (2013.01); *H01L 23/49541* (2013.01); *H01L 23/49582* (2013.01); *H01L 24/03* (2013.01); *H01L 24/09* (2013.01); *H01L 21/4842* (2013.01); *H01L 2224/02215* (2013.01); *H01L 2224/03019* (2013.01); *H01L 2224/03464* (2013.01); *H01L 2224/095* (2013.01); *H01L 2224/09183* (2013.01); *H01L 2924/01028* (2013.01); *H01L 2924/0133* (2013.01); *H01L 2924/01046* (2013.01); *H01L 2924/01047* (2013.01); *H01L 2924/01079* (2013.01); *H01L 2924/01103* (2013.01); *H01L 2924/12042* (2013.01); *H01L 2924/181* (2013.01); *H01L 2924/37* (2013.01)

(58) Field of Classification Search
CPC ......... H01L 24/97; H01L 24/45; H01L 24/83; H01L 24/08; H01L 24/38
See application file for complete search history.

(56) References Cited

U.S. PATENT DOCUMENTS

| | | | |
|---|---|---|---|
| 5,599,413 | A | 2/1997 | Nakao et al. |
| 6,573,121 | B2 | 6/2003 | Yoneda et al. |
| 7,087,461 | B2 | 8/2006 | Park et al. |
| 2005/0110010 | A1* | 5/2005 | Winter et al. ............ 257/40 |
| 2005/0214980 | A1 | 9/2005 | Shiu et al. |

(Continued)

FOREIGN PATENT DOCUMENTS

TW 461057 B 10/2001

*Primary Examiner* — Matthew W Such
*Assistant Examiner* — Krista Soderholm
(74) *Attorney, Agent, or Firm* — Murphy, Bilak & Homiller, PLLC

(57) ABSTRACT

A semiconductor package includes a plurality of bond pads having a first side and a second side opposing the first side, a coating covering the first side of the bond pads, semiconductor dies and electrical conductors attached to the second side of the bond pads, and a molding compound encasing the semiconductor dies and the electrical conductors at the second side of the bonds pads. The molding compound has a first side through which the bond pads protrude and a second side opposing the first side, the first side of the molding compound having a planar surface between adjacent ones of the bond pads. The package further includes a material plated on exposed sidewalls of the bonds pads uncovered by the molding compound and which is detectable by optical inspection. A corresponding method of manufacture is also provided.

18 Claims, 4 Drawing Sheets

(56) References Cited

U.S. PATENT DOCUMENTS

| | | |
|---|---|---|
| 2005/0218499 A1 | 10/2005 | Chang et al. |
| 2005/0287709 A1 | 12/2005 | Lee et al. |
| 2006/0231937 A1 | 10/2006 | Juskey et al. |
| 2007/0092991 A1 | 4/2007 | Masumoto |
| 2007/0161157 A1 | 7/2007 | Islam et al. |
| 2007/0184658 A1* | 8/2007 | Koyata et al. ............... 438/689 |
| 2008/0188015 A1 | 8/2008 | Sangaunwong et al. |
| 2008/0254392 A1* | 10/2008 | Yang ............................ 430/311 |
| 2010/0003894 A1 | 1/2010 | Miller et al. |
| 2014/0035113 A1* | 2/2014 | Kierse ........................... 257/676 |

\* cited by examiner

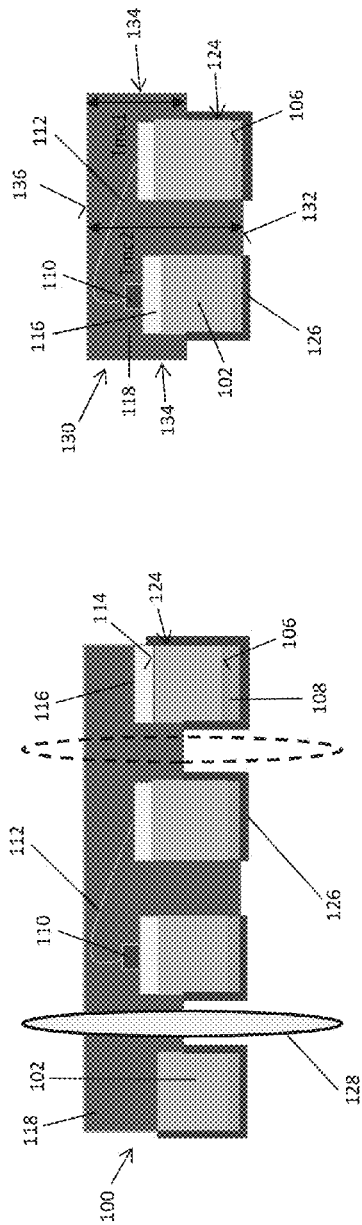
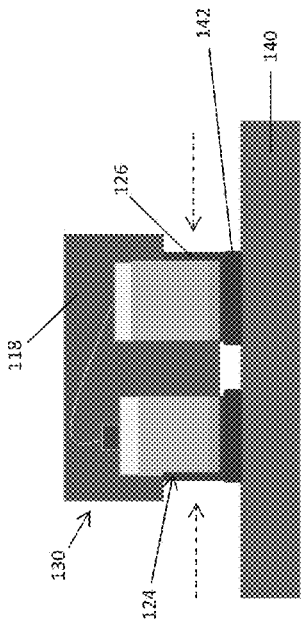
Figure 1E
Figure 1F
Figure 2

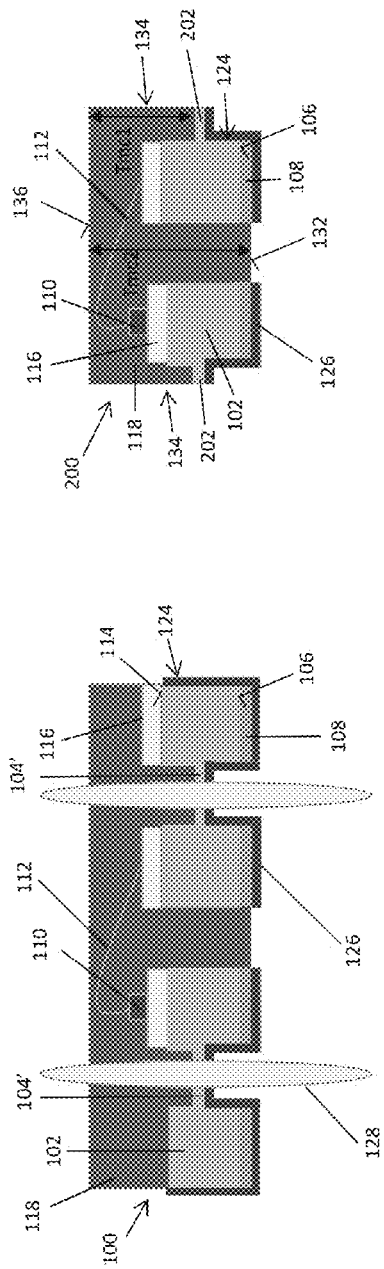
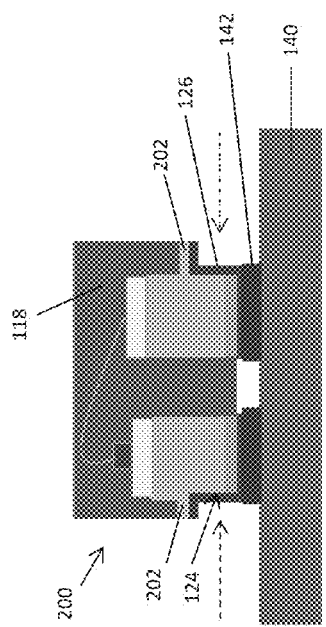

LEADLESS SEMICONDUCTOR PACKAGE WITH OPTICAL INSPECTION FEATURE

TECHNICAL FIELD

The instant application relates to leadless semiconductor packages, and more particularly to molded leadless semiconductor packages.

BACKGROUND

A lead frame forms the base or skeleton of an IC package, providing mechanical support to semiconductor dies during assembly into a finished package. A lead frame typically includes bonds pads such as die paddles for attaching semiconductor dies and leads for providing external electrical connections to the dies. The dies can be connected to the leads by wires, e.g. through wire bonding or tape automated bonds. Lead frames are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the bond pad construction described above.

Semiconductor dies attached to the die paddles after completion of the assembly process of a lead frame strip are usually tested after separation of the unit lead frames from the lead frame strip. Alternatively, the unit lead frames remain mechanically connected to the lead frame strip by tie bars during die testing. This is commonly referred to as lead frame strip testing. Separation of the unit lead frames from the lead frame strip occurs after electrical testing. In either case, the lead frame strips are then over-molded to form encapsulated individual packages which are then singulated (divided) into physically separate packages. The package singulation process conventionally involves sawing through the molding compound and the metal tie bars which electrical conductor adjacent bond pads for increased lead frame stability during earlier processing. Sawing through thick tie bars causes mechanical stress, and in the case of copper lead frames, copper burrs and copper particulate contamination. These issues can be reduced by slowing the sawing speed from 300 mm/s to 50 mm/s and providing a stronger spray to remove the copper particulates. However, such modifications to the singulation process increase the overall package cost due to the 2× slower sawing time and also decrease tool throughput.

SUMMARY

A method of manufacturing molded semiconductor packages comprises: providing a lead frame comprising a plurality of thicker bond pads interconnected by thinner tie bars at a first side of the bond pads; covering the first side of the bond pads with a material resistant to etching of the tie bars; attaching semiconductor dies and electrical conductors to a second side of the bond pads opposite the first side; encasing the semiconductor dies and the electrical conductors in a molding compound at the second side of the bonds pads; etching at least partly through the tie bars between the bond pads at the covered first side of the bond pads; plating exposed sidewalls of the bonds pads uncovered by the molding compound; and cutting through the molding compound in different regions where the tie bars were previously etched, to form separate packages.

According to an embodiment of a semiconductor package, the semiconductor package comprises a plurality of bond pads having a first side and a second side opposing the first side, a coating covering the first side of the bond pads, semiconductor dies and electrical conductors attached to the second side of the bond pads, and a molding compound encasing the semiconductor dies and the electrical conductors at the second side of the bonds pads. The molding compound has a first side through which the bond pads protrude and a second side opposing the first side, the first side of the molding compound having a planar surface between adjacent ones of the bond pads. The package further comprises a material plated on exposed sidewalls of the bonds pads uncovered by the molding compound and which is detectable by optical inspection.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A through 1F, illustrates different stages of an embodiment of a method of manufacturing molded semiconductor packages.

FIG. 2 illustrates a partial cross-sectional view of the semiconductor package shown in FIG. 1F attached to a printed circuit board.

FIG. 3, which includes FIGS. 3A through 3F, illustrates different stages of another embodiment of a method of manufacturing molded semiconductor packages.

FIG. 4 illustrates a partial cross-sectional view of the semiconductor package shown in FIG. 3F attached to a printed circuit board.

DETAILED DESCRIPTION

According to embodiments described herein, leadless semiconductor packages such as QFN (quad-flat no-leads), DFN (dual-flat no-leads), TSNP (Thin Small Non Leaded Package), etc. are manufactured as part of a lead frame strip. Leadless semiconductor packaging technology, also commonly known as MLP (micro leadframe) and SON (small-outline no leads), is a surface-mount technology for connecting integrated circuits (ICs) to surfaces of printed circuit boards (PCBs) without through-holes. The leadless semiconductor packages described herein have connector tie bars provided at the bottom side of the bond pads of the packages for interconnecting the bond pads during lead frame strip processing to provide stability. The bottom side of the bond pads are selectively pre-plated e.g. with NiPdAu or Ag. The tie bars are not plated. The lead frame strip is then molded. The bottom side of the bond pads and tie bars are not molded. The connector tie bars are then etched after molding at the unmolded bottom side of the tie bars and bond pads to remove all or part of the tie bars in the sawing street areas.

This way, during subsequent sawing in the sawing street areas, only the molding compound or the molding compound and at most a thin piece of the tie bars are cut by the sawing process. This allows for a faster sawing speed than is conventionally utilized when singulating the individual packages, while reducing the occurrence of burrs and metal particulates. For example the sawing speed can increase from a conventional speed of 20 mm/s to 300 mm/s, increasing throughout by 15×. The molded lead frame strip is also subjected to a plating process, whereby the exposed sidewalls of the bonds pads uncovered by the molding compound are plated with a material detectable by optical inspection. This plating process enables so-called LTI (lead tip inspection) at the sidewalls of the singulated packages.

Figure 1A:
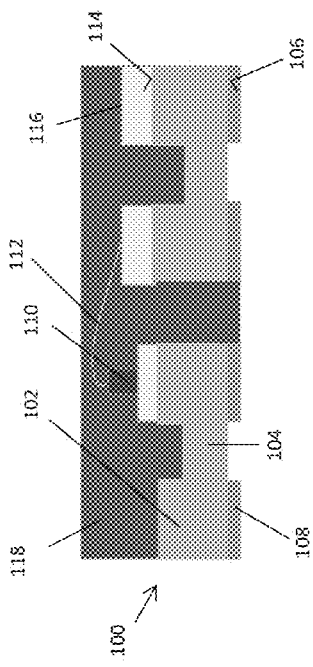

FIG. 1, which includes FIGS. 1A through 1F, illustrates respective partial cross-sectional views of a method of manufacturing molded semiconductor packages. The method comprises providing a lead frame 100 including thicker bond pads 102 interconnected by thinner tie bars 104 at a first side 106 of the bond pads 102. The tie bars 104 have a thickness Ttb and stabilize the bond pads 102 during processing of the lead frame strip 100. The bonds pads 102 can include die paddles for attaching semiconductor dies and leads for providing external electrical connections to the dies. FIG. 1A shows part of the lead frame strip 100.

In one embodiment, the lead frame strip 100 is constructed from flat sheet metal, e.g. by stamping or etching. For example, the sheet metal can be exposed to chemical etchants that remove areas not covered by photoresist. Other processing can be performed, e.g. laser etching to pattern the sheet metal. Metals typically used to manufacture lead frame strips include copper and copper alloys (generally referred to herein as comprising copper or copper lead frame strips), ferrous alloys usually containing nickel or cobalt or chromium (generally referred to herein as comprising iron or iron lead frame strips), nickel and nickel alloys (generally referred to herein as comprising nickel or nickel lead frame strips), and other metallic materials. After the patterning process, the patterned frames are singulated (separated) into lead frame strips. Part of one such lead frame strip 100 is shown in FIG. 1A.

The first side 106 of the bond pads 102 is selectively covered with a material 108 resistant to subsequent etching of the tie bars 104. In the case of copper bond pads 102 and tie bars 104, the first side 106 of the bond pads 102 can be selectively coated with NiPdAu. In another embodiment, the first side 106 of the bond pads 102 can be selectively coated with Ag also in the case of copper bond pads 102 and tie bars 104. Depending on the type of material from which the lead frame strip 100 is constructed, still other coatings may be selectively applied to the first side 106 of the bond pads 102. For example, in the case of iron and nickel lead frame strips, the same or different coating 108 can be selectively applied to the first side 106 of the bond pads 102 to protect the bond pads 102 during subsequent etching of the tie bars 104 as described in more detail later herein. Any standard lead frame coating process can be used to protect the first side 106 of the bond pads 102.

Semiconductor dies 110 and electrical conductors 112 are attached to the second side 114 of the bond pads 102 opposite the first side 106. The electrical conductors 112 can include bond wires, metal ribbons and/or metal clips. In each case, the second side 114 of the bond pads 102 can be coated with an attach material 116 such as Ag for attaching the semiconductor dies 110 and electrical conductors 112 to the bond pads 102 as shown in FIGS. 1A and 1B. The electrical conductors 112 can connect lead bond pads 102 to another lead bond pad 102 or to a terminal at the top side of one of the semiconductor dies 110 i.e. the side of the semiconductor die 110 facing away from the die paddle bond pad 102 to which the die 110 is attached.

FIG. 1B shows the structure after the semiconductor dies 110 and the electrical conductors 112 are encased in a molding compound 118 at the second side 114 of the bonds pads 102. Any standard molding process can be used. In general, the first side 106 of the bond pads 102 and the same side of the tie bars 104 remain uncovered by the molding compound 118. The molding compound 118 extends to the uncovered side of the coating 108 between adjacent die paddle and lead bond pads 102 of each package as shown in the center part of FIG. 1B, because there is no etching of the molding compound 118 between these two different types of pads 102. According to this embodiment, the molding compound 118 completely covers the facing sidewalls of adjacent ones of the die paddle and lead bond pads 102.

Figure 1C:
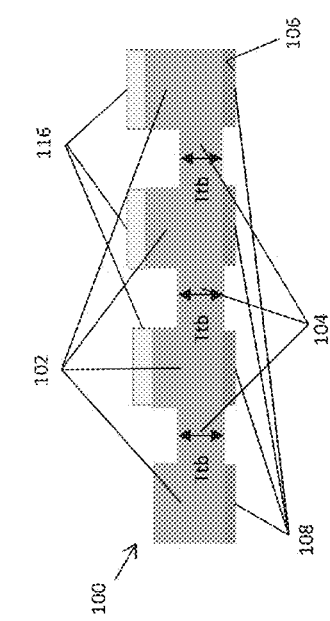
Figure 1B:
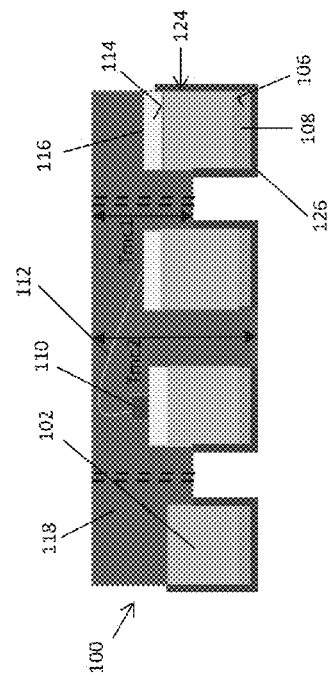

FIG. 1C shows the structure during an etching process in which the tie bars 102 are at least partly etched through between the bond pads 102 at the covered first side 106 of the bond pads 102. The first side 106 of the bond pads 102 is protected by a material 108 which is resistant to etching of the tie bars 104, as previously described herein. The tie bars 104 are unprotected at the first side 106 of the bond pads 102. The etching process can be controlled so that at least 50% of the tie bars 104 are etched through. In the embodiment, shown in FIG. 1C, the tie bars 104 are completely etched through between the bond pads 102 at the covered first side 106 of the bond pads 102. In one embodiment, the tie bars 104 are etched by directing a chemical etchant 120 from a spray nozzle 122 toward the tie bars 104 between the bond pads 102 at the covered first side 106 of the bond pads 102. In the case of copper bond pads 102 and tie bars 104, the chemical etchant 120 can comprise ammonia chloride or cupric chloride. In the case of iron or nickel bond pads 102 and tie bars 104, a different chemical etchant 120 can be used. The chemical etchant 120 is preferably anisotropic, but can be isotropic. Chemical etchants suitable for different metals and alloys are widely known, and therefore no further explanation is provided in this regard.

At this point in the method of FIG. 1, the tie bars 104 no longer hold the die pads 102 in place. Instead, the molding compound 118 provides sufficient stability.

Figure 1D:
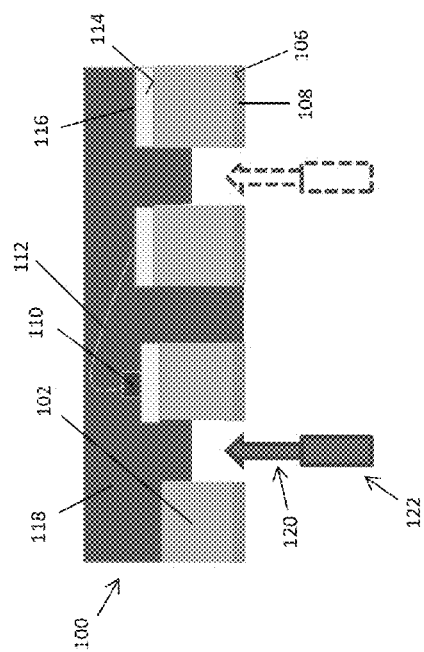

FIG. 1D shows the structure after plating of the exposed sidewalls 124 of the bonds pads 102 uncovered by the molding compound 118. The tie bars 104 were completely etched away in a previous stage, and therefore the exposed sidewalls 124 of the bonds pads 102 are plated by electroless deposition according to this embodiment. Electroless plating, also known as chemical or auto-catalytic plating, is a non-galvanic plating method that involves several simultaneous reactions in an aqueous solution, which occur without the use of external electrical power. In one embodiment, the exposed sidewalls 124 of the bonds pads 102 uncovered by the molding compound 118 are electrolessly plated with NiPAu. Silver, gold and copper layers can also be plated by electroless deposition.

The packages have yet to be singulated in FIG. 1D, but the saw streets are shown with dashed boxes to indicate where sawing will subsequently occur. As can be seen in FIG. 1D, the molding compound 118 is thinner (Tmc1) adjacent the outer sidewalls 124 of the outermost bond pads 102 of each package and thinner (Tmc2) inward. As such the plating 126 extends further up the outer sidewalls 124 of these bond pads 102, providing additional plated surface area for LTI (lead tip inspection) at the sides of the singulated packages. FIG. 1E shows the structure during the sawing process. The molding compound 118 is cut through in different regions where the tie bars 104 were previously etched, to form separate packages. Only the molding compound 118 is cut by a saw blade 128 according to this embodiment because the tie bars 104 were completely removed by the etching process previously described herein. Etching away the tie bars 104 allows for a faster sawing speed than is conventionally utilized when singulating the individual packages, while reducing the occurrence of burrs and metal particulates. For example the sawing speed can increase from 20 mm/s to 300 mm/s, increasing throughout by 15×. Any standard sawing process can be used to singulate the individual packages.

FIG. 1F shows one of the singulated packages 130. According to this embodiment, at least the exposed sidewalls 124 of the bonds pads 102 are planar and plated. Also according to this embodiment, the plating 126 extends further up the outer sidewalls 124 of the outermost bond pads 102 than along the other bond pad sidewalls 124 to provide additional plated surface area for LTI at the lateral sides of the singulated package 130. The bottom side 132 of the molding compound 118 is also planar with the side of the coating 108 facing away from the bond pads 102 because the molding compound 118 is unaffected by the etching process previously used to remove the tie bars 104. Also as can be seen in FIG. 1F, the molding compound 118 has lateral edges 134 extending between the bottom and top sides 132, 136 of the molding compound 118 and spaced apart from the outermost die pads 102. The thickness between the bottom and top sides 132, 136 of the molding compound 118 is greater (Tmc2) between adjacent ones of the bond pads 102 and thinner (Tmc1) between the lateral edges 134 of the molding compound 118 and the outermost bond pads 102.

FIG. 2 shows the singulated package 130 of FIG. 1F attached to a PCB 140 by attach material 142 such as solder. There is no standoff between adjacent die paddle and lead bond pads 102 of the singulated package 130 as shown in the center part of FIG. 2, because there is no etching of the molding compound 118 between these pads 102 as previously described herein. The exposed sidewalls 124 of the bonds pads 102 uncovered by the molding compound 118 are plated with a material 126 detectable by optical inspection as previously described herein. The sidewall plating 126 enables LTI at the lateral sides of the singulated package 130 after attachment to the PCB 140 as indicated by the inward facing dashed arrows in FIG. 2, to ensure the package 130 is properly joined to the PCB 140.

Figure 3A:
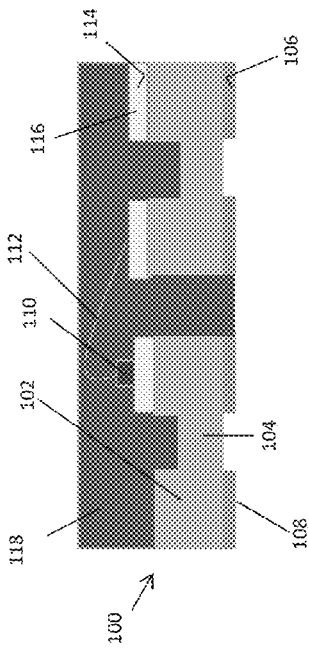
Figure 3B:
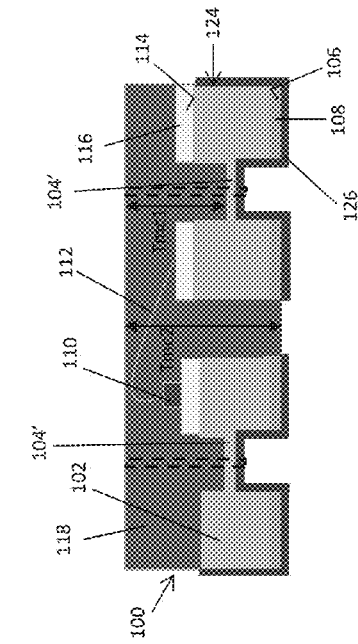

FIG. 3, which includes FIGS. 3A through 3G, illustrates respective partial cross-sectional views of another embodiment of a method of manufacturing molded semiconductor packages. FIGS. 3A and 3B are identical to FIGS. 1A and 1B, respectively, and therefore no further explanation is given in this regard.

Figure 3C:
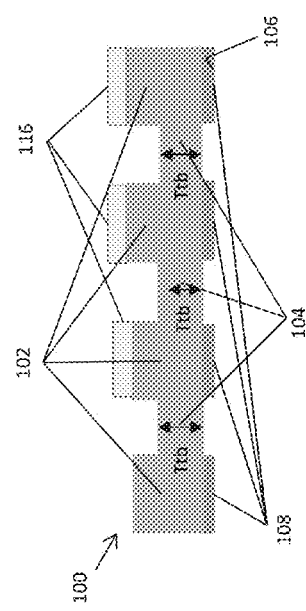

FIG. 3C shows the structure during an etching process in which the tie bars 104 are partly etched through between the bond pads 102 at the covered first side 106 of the bond pads 102. The first side 106 of the bond pads 102 is protected by a material 108 which is resistant to etching of the tie bars 104, as previously described herein. The tie bars 104 are unprotected at the first side 106 of the bond pads 102. In the embodiment shown in FIG. 3C, the tie bars 104 are partly etched so that the tie bars 104 remain intact but are thinned by at least 50% and less than 100%. In one embodiment, the tie bars 104 are etched by directing a chemical etchant 120 from a spray nozzle 122 toward the tie bars 104 between the bond pads 102 at the covered first side 106 of the bond pads 102. The speed (movement) of the spray nozzle 122 and exposure time can be controlled so that the tie bars 104 are not completely etched through.

At this point in the method of FIG. 2, a thin layer 104' of the tie bars 104 remains connected between adjacent ones of the bond pads 102.

Figure 3D:
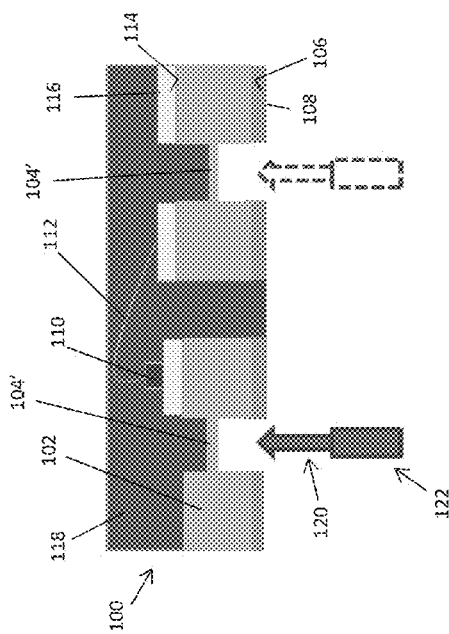

FIG. 3D shows the structure after plating of the exposed sidewalls 124 of the bonds pads 102 uncovered by the molding compound 118. The tie bars 104 remain intact after the etching according to this embodiment, so that the exposed sidewalls 124 of the bond pads 102 can be plated by electrolytic deposition which is faster and costs less than electroless deposition. With electrolytic deposition, an electrolytic cell (including two electrodes, electrolyte, and external source of current) is typically used for electro-deposition. In one embodiment, the exposed sidewalls 124 of the bonds pads 102 uncovered by the molding compound 118 are plated with NiPAu by electrolytic deposition. Tin, Silver, gold, copper, nickel and alloys can instead be applied by electrolytic deposition. With both electrolytic and electroless deposition, a special plating deposit called a strike or flash can be used to form a very thin (typically less than 0.1 micrometer thick) plating with high quality and good adherence to the exposed sidewalls 124 of the bonds pads 102 uncovered by the molding compound 118.

As can be seen in FIG. 3D, the molding compound 118 is thinner (Tmc1) adjacent the outer sidewalls 124 of the outermost bond pads 102 of each package and thinner (Tmc2) inward because there is no etching of the molding compound 118 between adjacent die paddle and lead bond pads 102 as previously described herein. As such the plating 126 extends further up the outer sidewalls 124 of outermost bond pads 102, providing additional plated surface area for LTI at the lateral sides of the singulated packages.

FIG. 3E shows the structure during the sawing process. The molding compound 118 is cut through in different regions where the tie bars 104 were previously etched, to form separate packages. According to this embodiment, the thin remaining tie bar layer 104' is also cut by sawing. Etching away at least 50% and less than 100% of the tie bars 104 allows for a faster sawing speed than is conventionally utilized when singulating the individual packages, while reducing the occurrence of burrs and metal particulates because only thin metal layers 104' are sawed.

FIG. 3F shows one of the singulated packages 200. According to this embodiment, the plating 126 extends further up the outer sidewalls 124 of the outermost bond pads 102 than along the other bond pad sidewalls 124 to provide additional plated surface area for LTI at the lateral sides of the singulated package 200. The bottom side 132 of the molding compound 118 is planar with the side of the coating 108 facing away from the bond pads 102 because the molding compound 118 is unaffected by the tie bar etching process. Also as can be seen in FIG. 3F, the molding compound 118 has lateral edges 134 extending between the bottom and top sides 132, 136 of the molding compound 118 and spaced apart from the outermost die pads 102. The thickness between the bottom and top sides 132, 136 of the molding compound 118 is greater (Tmc2) between adjacent ones of the bond pads 102 and thinner (Tmc1) between the lateral edges 134 of the molding compound 118 and the outermost bond pads 102. Severed lateral protrusions 202 can remain after the sawing process as a remnant of the thin (etched) tie bar layers 104', and extend from the outermost bond pads 102 to the lateral edges 134 of the molding compound 118.

FIG. 4 shows the singulated package 200 of FIG. 3F attached to a PCB 140 by attach material 142 such as solder. The exposed sidewalls 124 of the bonds pads 102 uncovered by the molding compound 118 are plated with a material 126 detectable by optical inspection as previously described herein. The sidewall plating 126 enables LTI at the lateral sides of the singulated package 130 after attachment to the PCB 140 as indicated by the inward facing dashed arrows in FIG. 4, to ensure the package 200 is properly joined to the PCB 140. As with the singulated package 130 shown in FIG. 2, there is no standoff between adjacent die paddle and lead bond pads 102 of the singulated package 200 as shown in the center part of FIG. 4 because there is no etching of the molding compound 118 between these pads 102 as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing molded semiconductor packages, the method comprising:
   providing a lead frame comprising a plurality of thicker bond pads interconnected by thinner tie bars at a first side of the bond pads;
   covering the first side of the bond pads with a material resistant to etching of the tie bars;
   attaching semiconductor dies and electrical conductors to a second side of the bond pads opposite the first side;
   encasing the semiconductor dies and the electrical conductors in a molding compound at the second side of the bonds pads;
   etching at least partly through the tie bars between the bond pads at the covered first side of the bond pads;
   plating exposed sidewalls of the bonds pads uncovered by the molding compound; and
   cutting through the molding compound in different regions where the tie bars were previously etched, to form separate packages,
   wherein some of the bond pads are die paddles and other ones of the bond pads are leads,
   wherein the molding compound extends to the material covering the first side of the bond pads between adjacent ones of the die paddles and leads so that the molding compound completely covers facing sidewalls of adjacent ones of the die paddle and lead bond pads and prevents the plating of the facing sidewalls.

2. The method of claim 1, wherein covering the first side of the bond pads with a material resistant to etching of the tie bars comprises:
   coating the first side of the bond pads with NiPdAu.

3. The method of claim 1, wherein covering the first side of the bond pads with a material resistant to etching of the tie bars comprises:
   coating the first side of the bond pads with Ag.

4. The method of claim 1, wherein attaching semiconductor dies and electrical conductors to the second side of the bond pads comprises:
   coating the second side of the bond pads with Ag; and
   attaching the semiconductor dies and electrical conductors to the second side of the bond pads via the Ag.

5. The method of claim 1, wherein the tie bars are completely etched through between the bond pads at the covered first side of the bond pads.

6. The method of claim 5, wherein the exposed sidewalls of the bonds pads are plated by electroless deposition.

7. The method of claim 1, wherein the tie bars are partly etched through between the bond pads at the covered first side of the bond pads so that the tie bars remain intact.

8. The method of claim 7, wherein the exposed sidewalls of the bonds pads are plated by electrolytic deposition.

9. The method of claim 1, wherein the exposed sidewalls of the bonds pads are plated with NiPAu.

10. The method of claim 1, wherein etching at least partly through the tie bars between the bond pads at the covered first side of the bond pads comprises:
    directing a chemical etchant from a spray nozzle toward the tie bars between the bond pads at the covered first side of the bond pads.

11. The method of claim 10, wherein the bond pads and the tie bars comprise copper and the chemical etchant comprises ammonia chloride or cupric chloride.

12. A semiconductor package, comprising:
    a plurality of bond pads having a first side and a second side opposing the first side;
    a coating covering the first side of the bond pads;
    semiconductor dies and electrical conductors attached to the second side of the bond pads;
    a molding compound encasing the semiconductor dies and the electrical conductors at the second side of the bonds pads, the molding compound having a first side through which the bond pads protrude and a second side opposing the first side, the first side of the molding compound having a planar surface between adjacent ones of the bond pads; and
    a material plated on exposed sidewalls of the bonds pads uncovered by the molding compound, the material being detectable by optical inspection,
    wherein some of the bond pads are die paddles and other ones of the bond pads are leads,
    wherein the molding compound extends to the coating covering the first side of the bond pads between adjacent ones of the die paddles and leads so that the molding compound completely covers facing sidewalls of adjacent ones of the die paddle and lead bond pads and prevents the material from being plated on the facing sidewalls.

13. The semiconductor package of claim 12, wherein outermost ones of the bonds pads have an outward facing sidewall that is planar and uncovered by the molding compound.

14. The semiconductor package of claim 12, wherein the coating covering the first side of the bond pads comprises NiPdAu.

15. The semiconductor package of claim 12, wherein the coating covering the first side of the bond pads comprises Ag.

16. The semiconductor package of claim 12, wherein the material plated on the exposed sidewalls of the bonds pads comprises NiPAu.

17. The semiconductor package of claim 12, wherein the molding compound has lateral edges extending between the first and second sides of the molding compound and spaced apart from the outermost die pads, and wherein a thickness between the first and the second sides of the molding compound is greater between adjacent ones of the bond pads than between the lateral edges and the outermost bond pads.

18. The semiconductor package of claim 12, further comprising a severed lateral protrusion extending from an outermost one of the bond pads to a lateral edge of the molding compound.

\* \* \* \* \*